(12) United States Patent
Heubi

(10) Patent No.: US 11,742,857 B2
(45) Date of Patent: Aug. 29, 2023

(54) WIDE VOLTAGE RANGE LEVEL SHIFTER CIRCUIT

(71) Applicant: SEMICONDUCTOR COMPONENTS INDUSTRIES, LLC, Phoenix, AZ (US)

(72) Inventor: Alexander Heubi, La Chaux-de-Fonds (CH)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

(21) Appl. No.: 17/810,745

(22) Filed: Jul. 5, 2022

(65) Prior Publication Data

US 2023/0060082 A1   Feb. 23, 2023

Related U.S. Application Data

(60) Provisional application No. 63/260,459, filed on Aug. 20, 2021.

(51) Int. Cl.
| H03K 19/01 | (2006.01) |
| H03K 19/0185 | (2006.01) |
| H03K 3/037 | (2006.01) |
| H03K 19/20 | (2006.01) |

(52) U.S. Cl.
CPC ..... *H03K 19/018521* (2013.01); *H03K 3/037* (2013.01); *H03K 19/20* (2013.01)

(58) Field of Classification Search
CPC ......... G06F 3/00; G06F 3/1295; H03K 5/003; H03K 19/0175
USPC ........................................................ 327/333
See application file for complete search history.

(56) References Cited

U.S. PATENT DOCUMENTS

| 10,432,199 B1* | 10/2019 | Zhang ................... H03K 3/037 |
| 2006/0071686 A1* | 4/2006 | Chang ............ H03K 19/018528 326/68 |
| 2007/0188193 A1* | 8/2007 | Narwal .......... H03K 19/018528 326/80 |

* cited by examiner

*Primary Examiner* — Quan Tra
(74) *Attorney, Agent, or Firm* — Polansky & Associates, P.L.L.C.; Paul J. Polansky; Nathan H. Calvert

(57) ABSTRACT

A level shifter circuit shifts a digital signal between first and second voltage levels. For a LOW to HIGH transition, an output PMOS transistor is switched on using a first NMOS transistor activated by the digital signal at the first voltage level while a second NMOS transistor is switched off to uncouple the output PMOS transistor from ground, and a third NMOS transistor is switched off to uncouple a current mirror circuit from ground. For a HIGH to LOW transition, the output PMOS transistor is switched off and a fourth NMOS transistor is switched on using an output of the current mirror circuit. The second NMOS transistor is switched on using an inverted version of the digital signal, and the current in the current mirror circuit is turned off with a fifth NMOS transistor when the drain of the output PMOS transistor approaches the voltage level of ground.

20 Claims, 4 Drawing Sheets

WIDE VOLTAGE RANGE LEVEL SHIFTER CIRCUIT

This application claims the benefit of U.S. Provisional Patent Application No. 63/260,459, filed on Aug. 20, 2021, the entire contents of which are incorporated herein by reference.

FIELD OF THE INVENTION

The disclosure relates to level shifter circuitry for integrated circuits, and particularly to wide range level shifter circuitry.

BACKGROUND

Level shifters are important interface circuits between voltage domains on an integrated circuit (IC). A digital signal flowing from a low-voltage domain such as a processor core domain to a high-voltage domain such as an input/output domain requires a shift up in voltage by a level shifter, while digital signals flowing in the other direction require a shift down in voltage. Commonly used level shifters are limited in their input to output voltage range and typically require large transistor devices on the lower voltage domain. This requirement negatively impacts both the semiconductor circuit area and power consumption of the level shifter. The speed of operation is also negatively impacted, especially when the input voltage is low and a shift is made to a high output voltage.

Some known approaches to solving these problems use a two or more voltage levels and two or more level shifting stages to shift voltages. However, such approaches require extra supply voltages to be generated, and use a much larger area than single-stage level shifters.

The use of the same reference symbols in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

Figure 1:
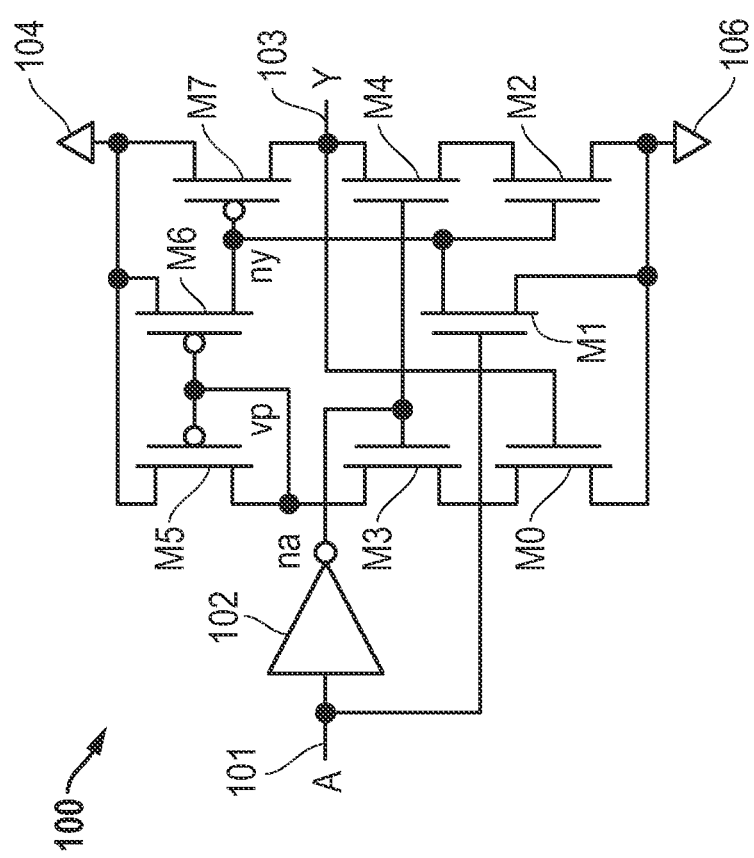
FIG. 1 illustrates in circuit diagram form a level shifter circuit according to some embodiments.

FIG. 1 illustrates in circuit diagram form a level shifter circuit 100 according to some embodiments. Level shifter circuit 100 is generally embodied on an integrated circuit and operates to level-shift an incoming digital signal "A" on an input terminal 101 in a first voltage supply domain to the voltage level of a second voltage domain as output signal Y at the level shifter output terminal 103.

Level shifter circuit 100 includes an inverter 102, number of n-type metal oxide semiconductor (NMOS) transistors M0-M4, a number p-type metal oxide semiconductor (PMOS) transistors M5-M7, wherein an output voltage supply for the second voltage domain is provided between a supply rail 104 and a ground 106, and is also generally referred to as "output voltage supply 104", an input terminal 101 receiving a digital signal A to be level shifted, and a second input labelled "na" receiving an inverted version of the digital signal to be level-shifted, and output terminal 103. The voltage supply for the first voltage domain is not separately shown.

Inverter 102 has an input receiving the digital signal A at input terminal 101, and an inverter output connected to the second input na. Inverter 102 is supplied in the first voltage domain.

PMOS transistors M5 and M6 form a current mirror circuit. PMOS transistor M5 has a source connected to output voltage supply 104, a drain, and a gate connected to the drain at a node labelled "vp". PMOS transistor M6 has a source connected to output voltage supply 104, a drain, and a gate. PMOS transistor M7 has a source connected to the output voltage supply 104, a drain connected to the level shifter output terminal 103, and a gate connected to the drain of the PMOS transistor M6 at a node labelled "ny".

NMOS transistors M3 and M0 are connected in series between the drain of PMOS transistor M5 and ground. NMOS transistor has a gate connected to second input na, and NMOS transistor M0 has a gate connected to a level shifter output terminal 103. NMOS transistor M1 has a source connected to ground 106, a gate connected to input terminal 101 and a drain connected to node ny. NMOS transistors M4 and M2 are connected in series between the drain of PMOS transistor M7 and ground. NMOS transistor M4 has a gate connected to the second input na. NMOS transistor M2 has a gate connected to the drain of the NMOS transistor M1.

In operation, for a LOW to HIGH transition of the digital signal at input terminal 101, PMOS transistor M7 is switched on using NMOS transistor M1, which activated by the digital signal A at the first voltage level. NMOS transistor M4 is switched off by the signal at second input na, uncoupling PMOS transistor M7 from ground. NMOS transistor M3 is switched off, uncoupling the current mirror circuit of M5 and M6 from ground.

For a HIGH to LOW transition of the digital signal, PMOS transistor M7 is switched off, and NMOS transistor M2 is switched on, both using a voltage generated at the output of the current mirror circuit at node ny. NMOS transistor M4 is switched on using an inverted version of the digital signal at node na. Current in the current mirror circuit of M5 and M6 is turned off using NMOS transistor M0 when the drain of the PMOS transistor M7 approaches the voltage level of ground. The current mirror formed by PMOS transistors M5 and M6 is sized such that the leakage currents ensure that node ny stays high and does not turn-on M7. To provide this effect of the leakage currents, PMOS transistor M5 has a gate length longer than that of PMOS transistor M6. PMOS transistor M2 ensures a proper operation when the input voltage is higher than the output voltage, preventing the current mirror from turning off to early, that is, before "ny" has reached the high state.

Level shifter circuit 100 provides a simple wide-range level shifter which does not require an intermediate voltage like that required by 2-stage level shifters (which are often used for low input voltages). Level shifter circuit 100 also has numerous advantages, including very fast operation for wide input and output voltage ranges, low power consumption for both static and dynamic power, and minimal area. In fact, the area for all devices except PMOS transistor M5 (as discussed above) can employ the minimum width and length for the technology node employed, such as 55 nanometer (nm) or 22 nm technology nodes. Importantly, level shifter circuit 100 is capable of sub-threshold operation, and does not suffer from excessive delays when the input voltage is near the voltage threshold of the transistors. For example, an embodiment using a 55 nm process node is able to operate with an input voltage as low as 0.55V, and an embodiment using a 22 nm process node is able to operate with an input voltage as low as 0.45V. Also, level shifter circuit 100 is able to be modified for functional extensions of a retention mode and a set-reset mode with little added complexity and few additional transistors, as shown below with respect to FIG. 2.

Figure 2:
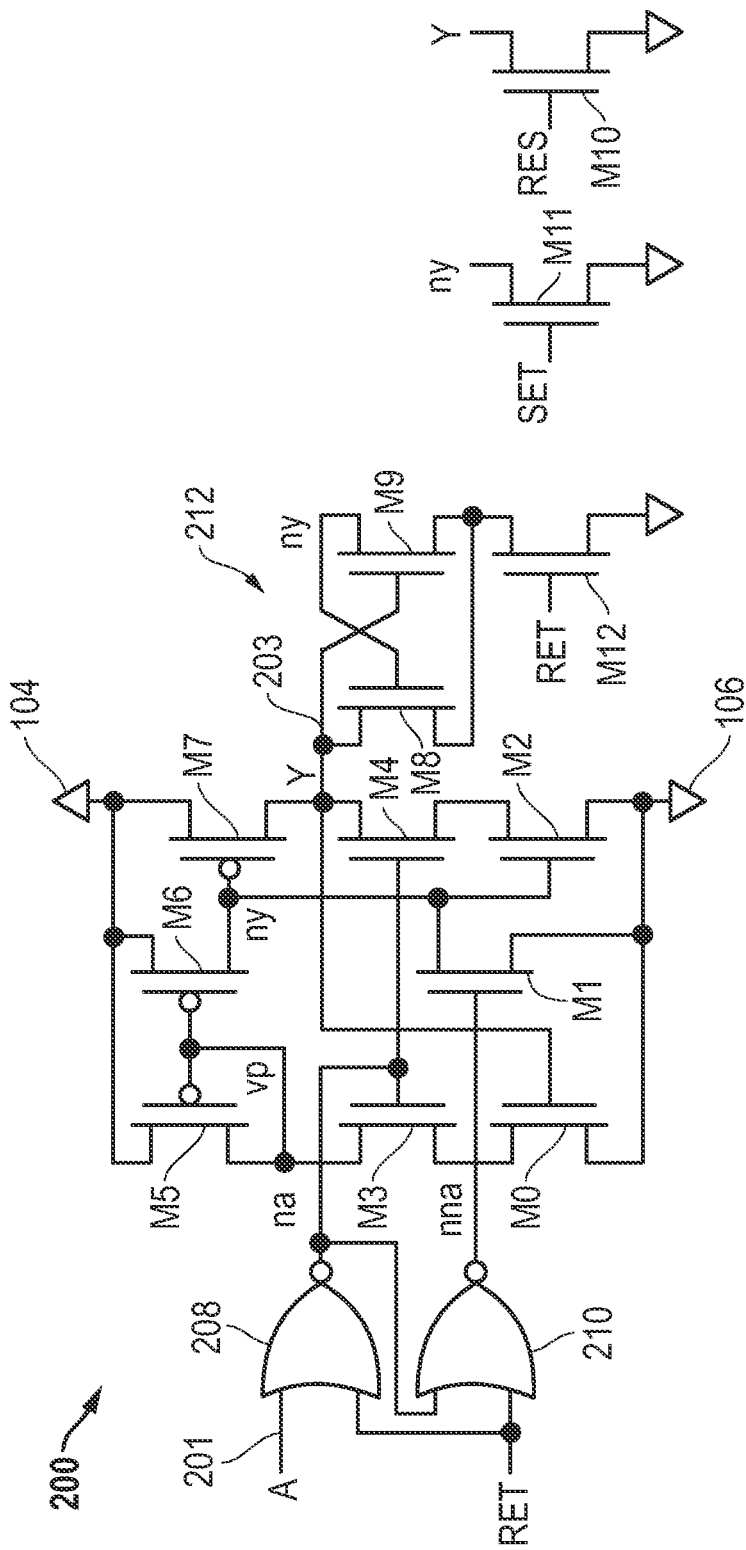
FIG. 2 illustrates in circuit diagram form a level shifter circuit including a retention mode and a set-reset function according to some embodiments.

FIG. 2 illustrates in circuit diagram form a level shifter circuit 200 including a retention mode and a set-reset function according to some embodiments. Level shifter circuit 200 includes has a first input terminal 101 receiving the digital signal A to be shifted, a retain input terminal labelled "RET", a set input terminal labelled "SET", a reset input terminal labelled "RES", and an output terminal 203 providing a level-shifted outputs signal "Y". The level-shifting portion of the circuit is constructed like that of FIG. 1, including transistors M0-M7. Level shifter circuit 200 also includes two NOR gates 208 and 210, and a set-reset latch 212.

NOR gate 208 has a first input connected to input terminal 201 receiving the digital signal to be shifted, and a second input receiving the retain signal RET, and an output connected to level shifter na. NOR gate 210 has a first input connected to the output of NOR gate 208, a second input receiving the retain signal RET, and an output connected to an input of the level shifter portion of the circuit labelled "nna".

Set-reset latch 212 includes an input coupled to the output terminal 203 of the level shifter, and five NMOS transistors labelled M8-M12. NMOS transistor M8 has a drain connected to the level shifter output terminal 203, a source, and a gate. NMOS transistor M9 has a drain coupled to the gate to NMOS transistor M8, a source, and a gate connected to the level shifter output terminal Y. NMOS transistor M10 has a drain connected to the level shifter output, a source connected to ground, and a gate receiving a reset signal labelled "RESET". NMOS transistor M11 has a drain connected to the drain of NMOS transistor M9, a source connected to ground, and a gate receiving a set signal labelled "SET". NMOS transistor M12 has a drain connected to the sources of NMOS transistors M8 and M9, a source connected to ground, and a gate receiving the retain signal RET.

In operation, the retention mode ensures that the level shifter state is retained in absence of an input signal input terminal A. In normal operation, with the RET signal LOW, an inverted version of the digital signal A at input terminal 201 is provided in normal operation at the output of NOR gate 208, and the digital signal A to be level shifted is provided to the level shifter portion of the circuit at node nna by inverting the signal at node na again with NOR gate 210. When the retain mode is activated by the RET signal going HIGH, nodes na and nna are held low. In parallel to this, NMOS transistors M8 and M9 are enabled by feeding the RET signal to NMOS transistor M12, latching the current state of the level shifter output 203. The set and reset functionality is also provided by NMOS transistors M10 and M11 when the retain mode is active. The level shifter output at output terminal 203 is set by the SET signal going HIGH (RES must LOW) and reset by the RES signal going HIGH (SET must be LOW). The SET and RES signals are on the domain of output voltage supply 104.

Figure 3:
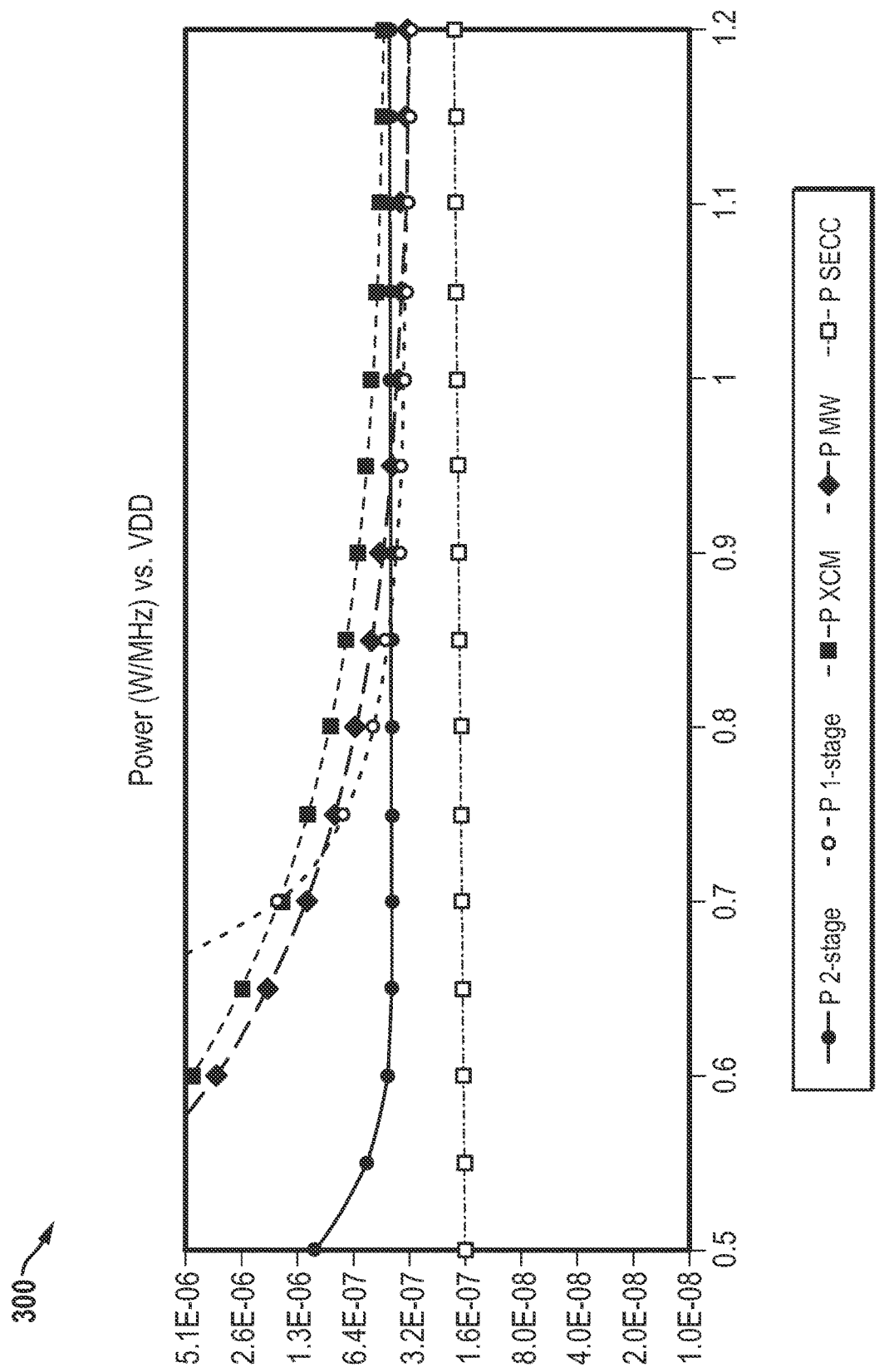
FIG. 3 shows a graph illustrating power consumption of the level shifter circuit of FIG. 1 as compared to a variety of other level shifter architectures.

FIG. 3 shows a graph 300 illustrating power consumption of level shifter circuit 100 as compared to a variety of other level shifter architectures. The input voltage level in volts is shown on the horizontal axis, and the power in watts (W) per megahertz (MHz) is shown logarithmically on the vertical axis. Graph 300 shows waveforms for power consumption of a typical two-stage level shifter labelled "P 2-stage", power consumption of a typical one-stage level shifter labelled "P 1-stage", power consumption of a crossed current mirror level shifter labelled "P XCM", power consumption of a modified Wilson level shifter labelled "P MW", and power consumption of level shifter circuit 100 of FIG. 1 labelled "P SECC". The power consumption is shown for a 3.6V level-shifted output voltage.

As can be seen in graph 300, the power consumption of level shifter 100 is almost constant with respect to the input voltage. Also, the power consumption of level shifter 100 is consistently around 50% lower than other depicted architectures, at around 0.16 microwatts (μW), as compared to the other architectures which consume over 1 μW at the lower input voltage, while at higher input voltages still consumes over 0.32 μW.

Figure 4:
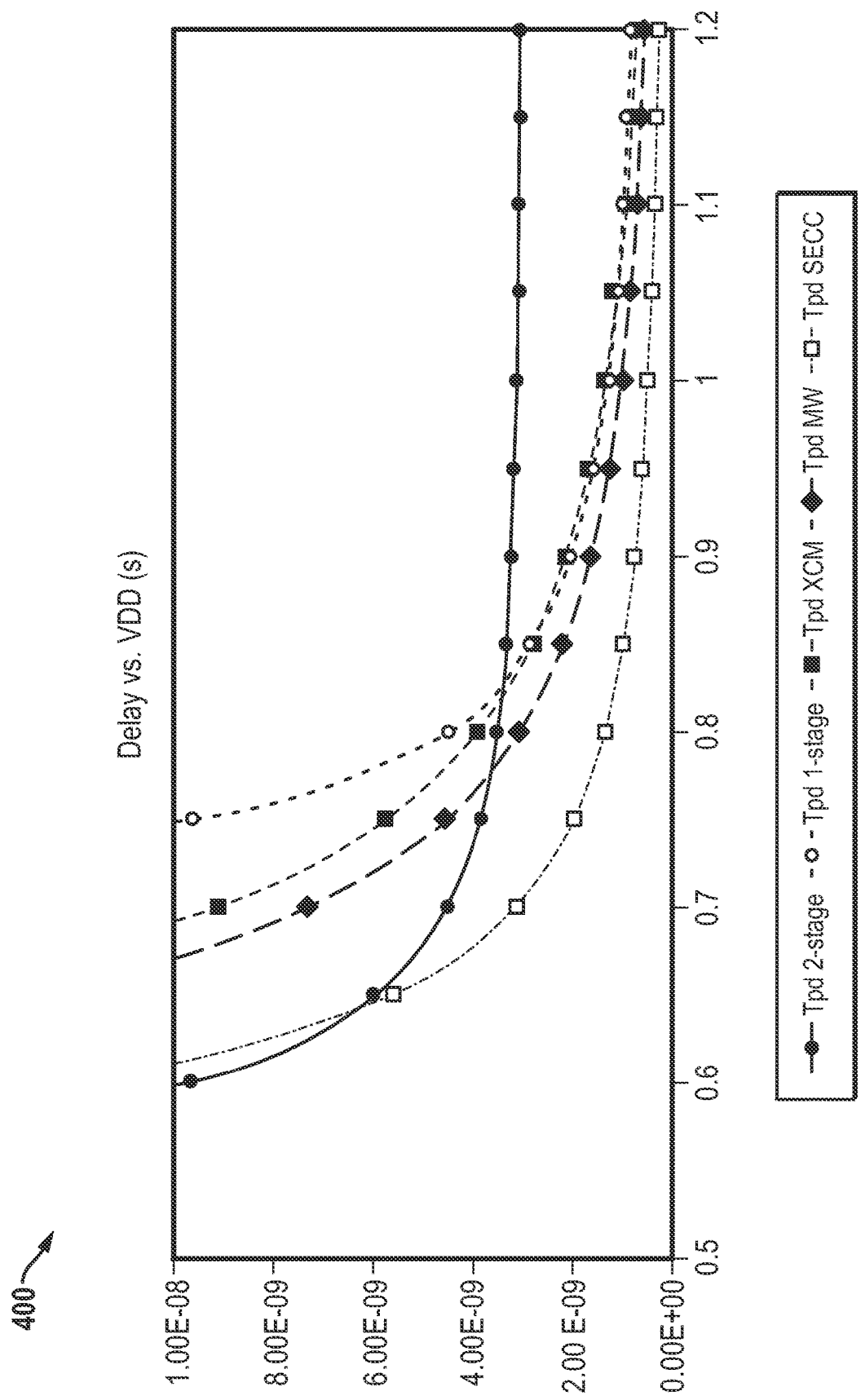
FIG. 4 shows a graph illustrating delay of the level shifter circuit as compared to a variety of other level shifter architectures.

FIG. 4 shows a graph 400 illustrating a delay of level shifter circuit 100 as compared to a variety of other level shifter architectures. The input voltage level in volts is shown on the horizontal axis, and signal delay through the level shifter is shown on the vertical axis in seconds (s). Graph 400 shows waveforms of delay for a typical two-stage level shifter labelled "Tpd 2-stage", delay of a typical one-stage level shifter labelled "Tpd 1-stage", delay of a crossed current mirror level shifter labelled "Tpd XCM", delay of a modified Wilson level shifter labelled "Tpd MW", and power consumption of level shifter circuit 100 of FIG. 1 labelled "Tpd SECC". The delay is shown for a 3.6V level-shifted output voltage.

As can be seen, level shifter 100 exhibits superior delay performance for almost the full input voltage range, and only the two-stage level shifter has superior performance toward the low end of input voltages at 0.6V. Furthermore, performance at the low end range of 0.65V input to 1V input is significantly better than most of the other architectures. Importantly, this performance advantage is achieved with a low transistor count as compared to most other architectures.

Thus, various embodiments of level shifter circuits, an integrated circuit including such level shifter circuits, and corresponding methods have been described. The driver circuits, associated logic, and receiver circuits described herein provide numerous advantages for level shifting across a wide range of voltages and speeds, and are suitable for use with a variety of technology nodes.

The above-disclosed subject matter is to be considered illustrative, and not restrictive, and the appended claims are intended to cover all such modifications, enhancements, and other embodiments that fall within the true scope of the claims. For example, particular technology node employed may vary. As another example, the digital logic employed to control the level shifter circuits herein, of course, vary while providing the same functionality.

Thus, to the maximum extent allowed by law, the scope of the present invention is to be determined by the broadest permissible interpretation of the following claims and their equivalents, and shall not be restricted by the forgoing detailed description.

What is claimed is:

1. A level shifter circuit comprising:
a first input receiving a digital signal to be level shifted, and a second input receiving an inverted version of the digital signal to be level-shifted;
a current mirror circuit including a first p-type metal oxide semiconductor (PMOS) transistor (M5) with a source connected to an output voltage supply, a drain, and a gate connected to the drain, and a second PMOS transistor (M6) with a source connected to the output voltage supply, a drain, and a gate;
first and second n-type metal oxide semiconductor (NMOS) transistors (M3, M0) connected in series between the drain of the first PMOS transistor and ground, the first NMOS transistor having a gate connected to the second input, the second NMOS transistor having a gate connected to a level shifter output terminal (Y);
a third PMOS transistor (M7) having a source connected to the output voltage supply, a drain connected to the level shifter output terminal, and a gate connected to the drain of the second PMOS transistor (M6);
a third NMOS transistor (M1) having a source connected to ground, a gate connected to the first input, and a drain; and
fourth and fifth NMOS transistors (M4, M2) connected in series between the drain of the third PMOS transistor (M7) and ground, the fourth NMOS transistor having a gate connected to the second input, the fifth NMOS transistor having a gate connected to the drain of the third NMOS transistor.

2. The level shifter of claim 1, further comprising:
an inverter having an inverted input receiving the digital signal and an inverter output connected to the second input, the inverter input connected to the first input.

3. The level shifter of claim 1, further comprising:
a first NOR gate with a first input receiving the digital signal to be shifted, a second input receiving a retain signal, and an output connected to the second input of the level shifter; and
a second NOR gate with a first input connected to the output of the first NOR gate, a second input receiving the retain signal, and an output connected to the first input of the level shifter.

4. The level shifter of claim 3, further comprising:
a set-reset latch with an input coupled to the output of the level shifter.

5. The level shifter of claim 4, wherein the set-reset latch further comprises:
a sixth NMOS transistor (M8) with a drain connected to the level shifter output, a source, and a gate;
a seventh NMOS transistor (M9) with a drain coupled to the gate of the sixth NMOS transistor, a source, and a gate connected to the level shifter output; and
an eighth NMOS transistor (M12) with a drain connected to the sources of the sixth and seventh NMOS transistors, a source connected to ground, and a gate receiving the retain signal.

6. The level shifter of claim 5, wherein the set-reset latch further comprises:
a ninth NMOS transistor (M10) with a drain connected to the level shifter output, a source connected to ground, and a gate receiving a reset signal; and
a tenth NMOS transistor (M11) with a drain connected to the drain of the seventh NMOS transistor (M9), a source connected to ground, and a gate receiving a set signal.

7. The level shifter of claim 1, wherein:
The first PMOS transistor (M5) has a gate length longer than that of the second PMOS transistor (M6).

8. A method of voltage shifting a digital signal from a first voltage level to a second voltage level, comprising:
supplying the second voltage level to an output PMOS transistor (M7);
for a LOW to HIGH transition of the digital signal, switching on the output PMOS transistor using a first NMOS transistor (M1) activated by the digital signal at the first voltage level while switching off a second NMOS transistor (M4) to uncouple a drain of the output PMOS transistor (M7) from ground and switching off a third NMOS transistor (M3) to uncouple a current mirror circuit (M5, M6) from ground; and
for a HIGH to LOW transition of the digital signal, switching off the output PMOS transistor (M7) and switching on a fourth NMOS transistor (M2) both using an output of the current mirror circuit, switching on the second NMOS transistor (M4) using an inverted version of the digital signal, and turning off the current in the current mirror circuit with a fifth NMOS transistor (M0) when the drain of the output PMOS transistor approaches the voltage level of ground.

9. The method of claim 8, further comprising:
providing the inverted version of the digital signal with an inverter supplied at the first voltage level.

10. The method of claim 8, further comprising:
providing the inverted version of the digital signal with a first NOR gate supplied at the first voltage level, the NOR gate including two inputs receiving the digital signal and a retain signal, respectively; and
providing the digital signal with second NOR gate supplied at the first voltage level, the NOR gate including two inputs receiving the output of the first NOR gate and and the retain signal, respectively.

11. The method of claim 10, further comprising:
feeding set and reset signals to respective inputs of a set-reset latch coupled to a drain of the output PMOS transistor (M7).

12. The method of claim 11, further comprising:
feeding retrain signal to the gate of an NMOS transistor coupling the set-reset latch to ground.

13. An integrated circuit comprising:
a first group of digital circuits supplied by a first voltage supply at a first voltage level;
a second group of digital circuit supplied by a second voltage supply at a second voltage level different from the first voltage level;
level shifter circuit for shifting a digital signal from the first voltage level to the second voltage level, comprising:
a first input receiving the digital signal and a second input receiving an inverted version of the digital signal;
a current mirror circuit including a first p-type metal oxide semiconductor (PMOS) transistor (M5) with a source connected to an output voltage supply, a drain, and a gate connected to the drain, and a second PMOS transistor (M6) with a source connected to the output voltage supply, a drain, and a gate;
first and second n-type metal oxide semiconductor (NMOS) transistors (M3, M0) connected in series between the drain of the first PMOS transistor and ground, the first NMOS transistor having a gate connected to the second input, the second NMOS transistor having a gate connected to a level shifter output terminal (Y);

a third PMOS transistor (M7) having a source connected to the output voltage supply, a drain connected to the level shifter output terminal, and a gate connected to the drain of the second PMOS transistor (M6);

a third NMOS transistor (M1) having a source connected to ground, a gate connected to the first input, and a drain; and fourth and fifth NMOS transistors (M4, M2) connected in series between the drain of the third PMOS transistor (M7) and ground, the fourth NMOS transistor having a gate connected to the second input, the fifth NMOS transistor having a gate connected to the drain of the third NMOS transistor.

14. The integrated circuit of claim 13, further comprising:
an inverter having an inverted input receiving the digital signal and an inverter output connected to the second input, the inverter input connected to the first input.

15. The integrated circuit of claim 13, further comprising:
a first NOR gate with a first input receiving the digital signal to be shifted, a second input receiving a retain signal, and an output connected to the second input of the level shifter; and
a second NOR gate with a first input connected to the output of the first NOR gate, a second input receiving the retain signal, and an output connected to the first input of the level shifter.

16. The integrated circuit of claim 15, further comprising:
a set-reset latch with an input coupled to the output of the level shifter.

17. The integrated circuit of claim 16, wherein the set-reset latch further comprises:
a sixth NMOS transistor (M8) with a drain connected to the level shifter output, a source, and a gate;
a seventh NMOS transistor (M9) with a drain coupled to the gate of the sixth NMOS transistor, a source, and a gate connected to the level shifter output; and
an eight NMOS transistor (M12) with a drain connected to the sources of the sixth and seventh NMOS transistors, a source connected to ground, and a gate receiving the retain signal.

18. The integrated circuit of claim 17, wherein the set-reset latch further comprises:
a ninth NMOS transistor (M10) with a drain connected to the level shifter output, a source connected to ground, and a gate receiving a reset signal; and
a tenth NMOS transistor (M11) with a drain connected to the drain of the seventh NMOS transistor (M9), a source connected to ground, and a gate receiving a set signal.

19. The integrated circuit of claim 13, wherein:
the first PMOS transistor (M5) has a gate length longer than that of the second PMOS transistor (M6).

20. The integrated circuit of claim 13, wherein:
the level shifter is able to operate when the digital signal is at a sub-threshold level with respect to a threshold voltage (Vth) of the NMOS transistors.

* * * * *